United States Patent [19]
Fischer et al.

[11] Patent Number: 6,140,852
[45] Date of Patent: Oct. 31, 2000

[54] DIGITAL PHASE-LOCKED LOOP WITH PULSE CONTROLLED CHARGE PUMP

[75] Inventors: Jonathan H. Fischer, Blandon; Wenzhe Luo, Allentown, both of Pa.

[73] Assignee: Lucent Technologies, Inc., Murray Hill, N.J.

[21] Appl. No.: 09/188,195

[22] Filed: Nov. 9, 1998

[51] Int. Cl.[7] .................................................. H03L 7/06
[52] U.S. Cl. .............................. 327/156; 327/7; 327/141; 327/147; 327/150; 327/151; 327/5; 331/25
[58] Field of Search .................................... 327/141, 147, 327/150, 151, 156, 5, 7; 331/25

[56] References Cited

U.S. PATENT DOCUMENTS

| | | | |
|---|---|---|---|
| 5,241,567 | 8/1993 | Shimakata | 375/82 |
| 5,493,243 | 2/1996 | Ghoshal | 327/158 |

*Primary Examiner*—Margaret R. Wambach
*Assistant Examiner*—Cassandra Cox
*Attorney, Agent, or Firm*—William H. Bollman

[57] ABSTRACT

A digital phase locked loop includes a digital phase detector which provides a magnitude control signal to adjust the step size of up and down adjustments in the phase/frequency of a digitally controlled oscillator, resulting in shorter lock-in or acquisition time and smaller jitter as compared to conventional digital phase locked loop devices. In the disclosed embodiments, the digital phase detector includes multiple bit shift registers in both the up and down directions to count or measure a number of up or down minimum width pulses and provide a pulse magnitude control based on the value of the shift registers to the digitally controlled oscillator. The digitally controlled oscillator includes a charge pump and voltage controlled oscillator. In one embodiment, the charge pump provides programmable control over its output current pulses to a capacitor which controls the output frequency of the voltage controlled oscillator.

18 Claims, 10 Drawing Sheets

DIGITAL PHASE DETECTOR TYPE PLL DESIGN WITH MAGNITUDE CONTROL

FIG. 1
PRIOR ART
THE DESIGN OF A PLL DESIGN WITH A DIGITAL PHASE DETECTOR

FIG. 2
DIGITAL PHASE DETECTOR TYPE PLL DESIGN WITH MAGNITUDE CONTROL

PUMP CURRENT GENERATOR AND MULTIPLICATION CONTROL

FIG. 8
CHARGE PUMP CURRENT MOTOR

BIAS CURRENT GENERATOR

DIGITAL PHASE-LOCKED LOOP WITH PULSE CONTROLLED CHARGE PUMP

BACKGROUND OF THE INVENTION

1. Field of the Invention

This invention relates generally to the design of phase locked loops. More particularly, it relates to a digital phase locked loop having improved acquisition and jitter characteristics, and/or having a high-current, high-precision charge pump.

2. Background of Related Art

Figure 1:
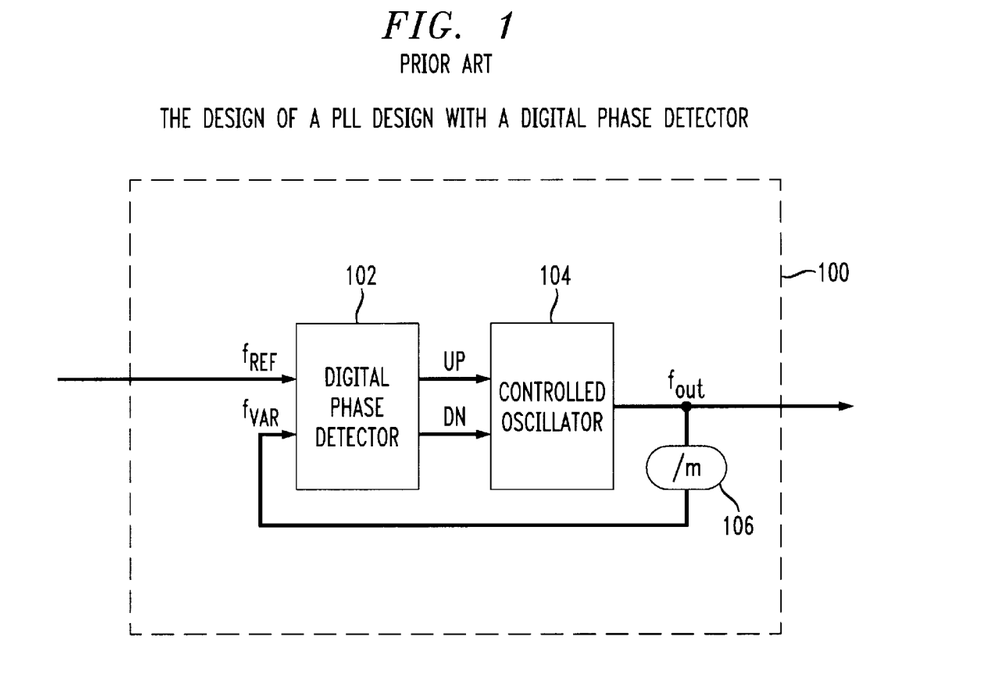
FIG. 1 shows a conventional digital phase locked loop having a digital phase detector.

A conventional digital phase locked loop (PLL) 100 as shown in FIG. 1 comprises two main components: a digital phase detector 102 and a controlled oscillator 104.

In FIG. 1, a digital phase detector 102 receives both a reference frequency signal $f_{REF}$ and a variable frequency signal $f_{VAR}$. The reference frequency signal $f_{REF}$ is, e.g., an output of a highly accurate crystal oscillator. The variable frequency signal $f_{VAR}$ is typically the output frequency, or the output frequency divided by a frequency divider 106 to provide a slower rate clock signal, allowing the use of a slower rate crystal oscillator or other clock source as the reference frequency signal $f_{REF}$.

The digital phase detector 102 compares the phase of the reference frequency signal $f_{REF}$ with that of the variable frequency signal $f_{VAR}$ to determine whether or not the relative phase and frequency of the output signal $f_{OUT}$ of the PLL 100 is higher or lower than expected.

If the output frequency signal $f_{OUT}$ is too high as compared to the reference frequency signal $f_{REF}$, the digital phase detector 102 activates a slow down signal DN to the controlled oscillator 104 to slow down the frequency and/or shift the phase of the output frequency signal $F_{OUT}$ of the PLL 100. If, on the other hand, the output frequency and/or phase of the output frequency signal $F_{OUT}$ is too low, the digital phase detector 102 provides a speed up signal UP to the controlled oscillator 104 to speed up the frequency and/or shift the phase of the output frequency signal $F_{OUT}$ of the PLL 100. Thus, the controlled oscillator 104 adjusts its output frequency signal $F_{OUT}$ in accordance with UP/DN controls provided by the digital phase detector 102.

Many mechanisms can be used to provide the adjustment in the frequency and/or phase of the output frequency signal $f_{OUT}$. For instance, a popular mechanism is the use of a charge pump and a loop filter to transform the UP/DN pulse controls from the digital phase detector 102 into a voltage charged on a capacitor, which then controls the frequency of a voltage controlled oscillator (VCO) in the controlled oscillator 104.

With digital PLLs, instruction signals from the digital phase detector 102 to the digitally controlled oscillator 104 have only two basic modes, i.e., UP and DN (and a third mode of neither up or down, typically represented by the simultaneous activation of both the UP and DN signals). The width of the UP and DN control signal pulses to the controlled oscillator 104 are varied based on the phase difference between the reference frequency signal $f_{REF}$ and the variable frequency $f_{VAR}$. Among other factors, resolution in the width of the UP and DN control signal pulses results in a given amount of jitter and requires a given amount of acquisition time to lock phases. Thus, the resolution of the pulse width of both the UP and DN control signals is minimized, but nevertheless has a finite, digitally derived width limited by the speed of the digital logic for activating and deactivating the UP and DN control signal pulses.

Thus, when the PLL 100 is locked, the digital phase detector 102 will activate both the UP and DN signals each having a minimum pulse width. Then, if the output frequency signal $f_{OUT}$ as determined by a comparison of the variable frequency signal $f_{VAR}$ to the reference frequency signal $f_{REF}$ falls behind, the digital phase detector 102 will widen the activation pulse of the UP control signal to have an appropriately larger width than the DN control signal. On the other hand, if the output frequency signal $f_{OUT}$ becomes ahead in phase as determined by a comparison of the variable frequency signal $f_{VAR}$ to the reference frequency signal $f_{REF}$, then the digital phase detector 102 will widen the activation pulse of the DN control signal to be wider than the activation pulse of the UP control signal, which may be at a minimum pulse width.

Unfortunately, the jitter and/or acquisition time characteristics of a conventional digital phase locked loop are related to the resolution of the control signals from a phase detector to a digitally controlled oscillator. As requirements for more stable clock signals derived from digital phase locked loops continue to tighten, there has become a need for more accurate control of a digital phase locked loop to provide improved jitter and/or acquisition time characteristics over conventional digital phase locked loop devices.

SUMMARY OF THE INVENTION

In accordance with the principles of the present invention, a digital phase locked loop comprises a digital phase detector, and a digitally controlled oscillator. The digital phase detector controls the digitally controlled oscillator with two directional controls and at least one magnitude control.

In accordance with another aspect of the present invention, a digital phase detector comprises a comparator adapted to compare at least one of a phase and a frequency of a reference frequency signal to the at least one of a phase and a frequency of a variable frequency signal, and to output a signal indicating a determined direction for the variable frequency to be changed to equate to the reference frequency signal. A magnitude measurement circuit is adapted to output a relative magnitude in a determined direction of an output of said variable frequency.

A method of controlling a digitally controlled oscillator in accordance with the principles of the present invention comprises providing a direction control to the digitally controlled oscillator. A magnitude control separate from the direction control is provided to the digitally controlled oscillator. The digitally controlled oscillator will be caused to step toward a desired frequency at a faster rate when outputting a variable frequency which is farther from the desired frequency than when near the desired frequency.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides another dimension of oscillator control from a digital phase detector by utilizing consecutive phase-frequency comparison results. In this added circuit of phase detection, the number of times that the phase comparison provides the same result (i.e., the number of consecutive UP control signal pulses from a digital phase detector or the number of consecutive DN control signal pulses from the digital phase detector) is recorded and provided to a digitally controlled oscillator for magnitude control purposes. Thus, in addition to the sign based UP/DN control signals, a quantity signal, e.g., a magnitude control signal MC, is provided by a digital phase detector to a digitally controlled oscillator, in accordance with the principles of the present invention. This magnitude control signal MC adaptively adjusts a step size in the digitally controlled oscillator, e.g., by increasing a pulse current to a charge capacitor driving a voltage controlled oscillator, resulting in a shorter acquisition time and smaller jitter (two very important design parameters for PLLs) as compared to conventional digital PLLs.

Figure 2:
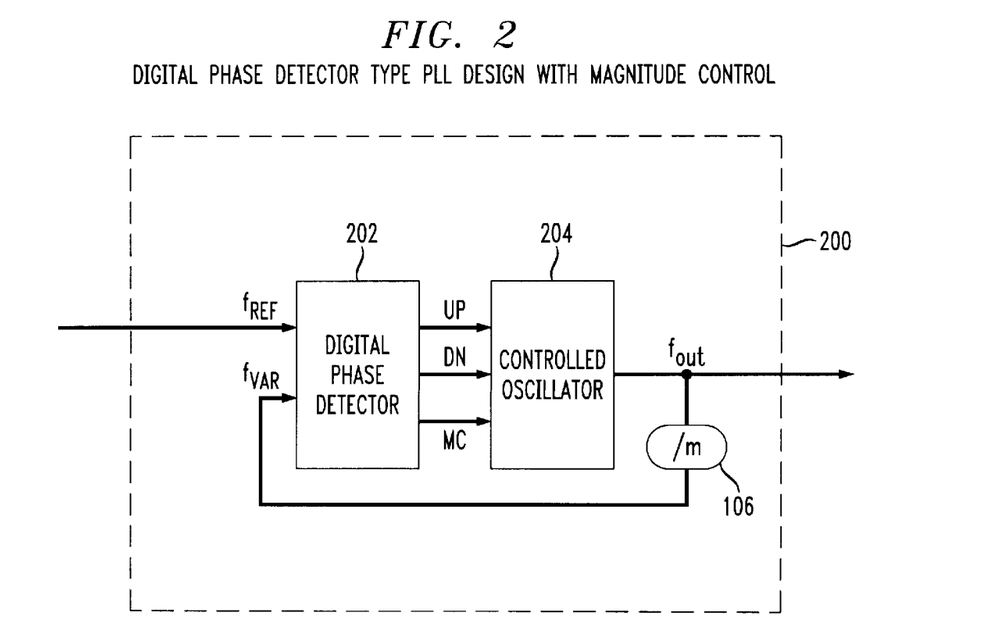
FIG. 2 shows a block diagram of a digital phase locked loop including a digital phase detector in accordance with the principles of the present invention.

FIG. 2 shows a block diagram of a digital PLL 200 having, in addition to otherwise conventional UP and DN control signals, a magnitude or step size control signal MC provided by a digital phase detector 202 to a digitally controlled oscillator 204.

In particular, a frequency divider 106 is optionally provided in a feedback path between an output frequency signal $F_{OUT}$ and a variable frequency signal $f_{VAR}$ input to a digital phase detector 202, and a reference frequency signal $f_{REF}$ is input to the digital phase detector 202, otherwise as in a conventional digital PLL, e.g., as shown in FIG. 1. Moreover, the digital phase detector 202 provides UP and DN control signals to a digitally controlled oscillator 204. However, in addition to UP and DN control signals, a digital phase detector 202 in accordance with the principles of the present invention further provides a step size or magnitude control signal to the digitally controlled oscillator 204 to set an adjustment step size in the up and down directions for each UP and DN control signal. Thus, based on the magnitude control signal MC, the adjusted size of the phase/frequency for each relative portion of the pulse width of both the UP and DN signals is set according to a desired parameter.

For instance, initially, when the PLL 200 is first started up, the output frequency signal $F_{OUT}$ will likely be quite far from the frequency and/or phase of the reference frequency signal $f_{REF}$. Thus, in this case, a large step size for each pulse width of the UP and/or DN control signals would be desired in the digitally controlled oscillator 204 to take larger and quicker strides toward outputting the ultimate frequency and/or phase from the PLL 200. Then, as the digital phase detector 202 senses that the frequency and/or phase is approaching that of the desired frequency and/or phase of the reference frequency signal $f_{REF}$, the step size of the adjustments in the digitally controlled oscillator 204 can be appropriately reduced for greater accuracy and lower jitter. Then, as the output frequency signal $F_{OUT}$ becomes initially locked to that of the reference frequency signal $f_{REF}$, the step size in the digitally controlled oscillator 204 can be set to a minimum by the digital phase detector 202 using the magnitude control signal MC to provide for the lowest jitter possible. Thus, larger step sizes in the adjustments of the digitally controlled oscillator 204 can be used initially to achieve faster acquisition of the target frequency and/or phase, while smaller step sizes can be subsequently used to provide a lowest possible jitter in the locked output frequency signal $F_{OUT}$.

The magnitude control signal may be a serial signal or a parallel signal, and may have virtually any number of values. For instance, the magnitude control signal may be a single bit line having only two settings, i.e., high for large step size and low for small step size. Alternatively, the magnitude control signal may be a multiple bit value passed over either a serial or parallel communication path to the digitally controlled oscillator 204 to provide multiple step size control of the adjustments to the output frequency signal $F_{OUT}$.

Figure 3A:
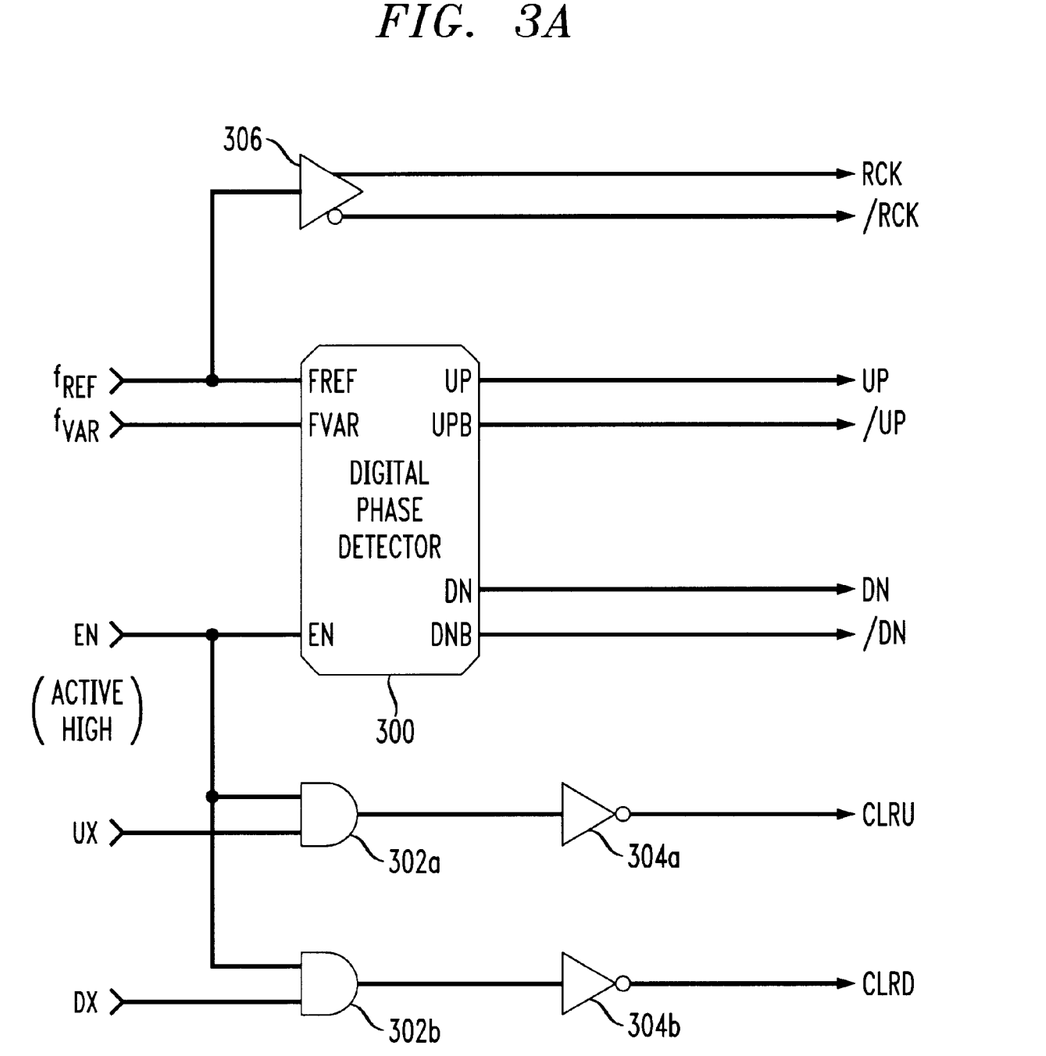
FIGS. 3A and 3B show a schematic diagram of a digital phase detector with adaptive magnitude control as shown in FIG. 2.
Figure 3B:
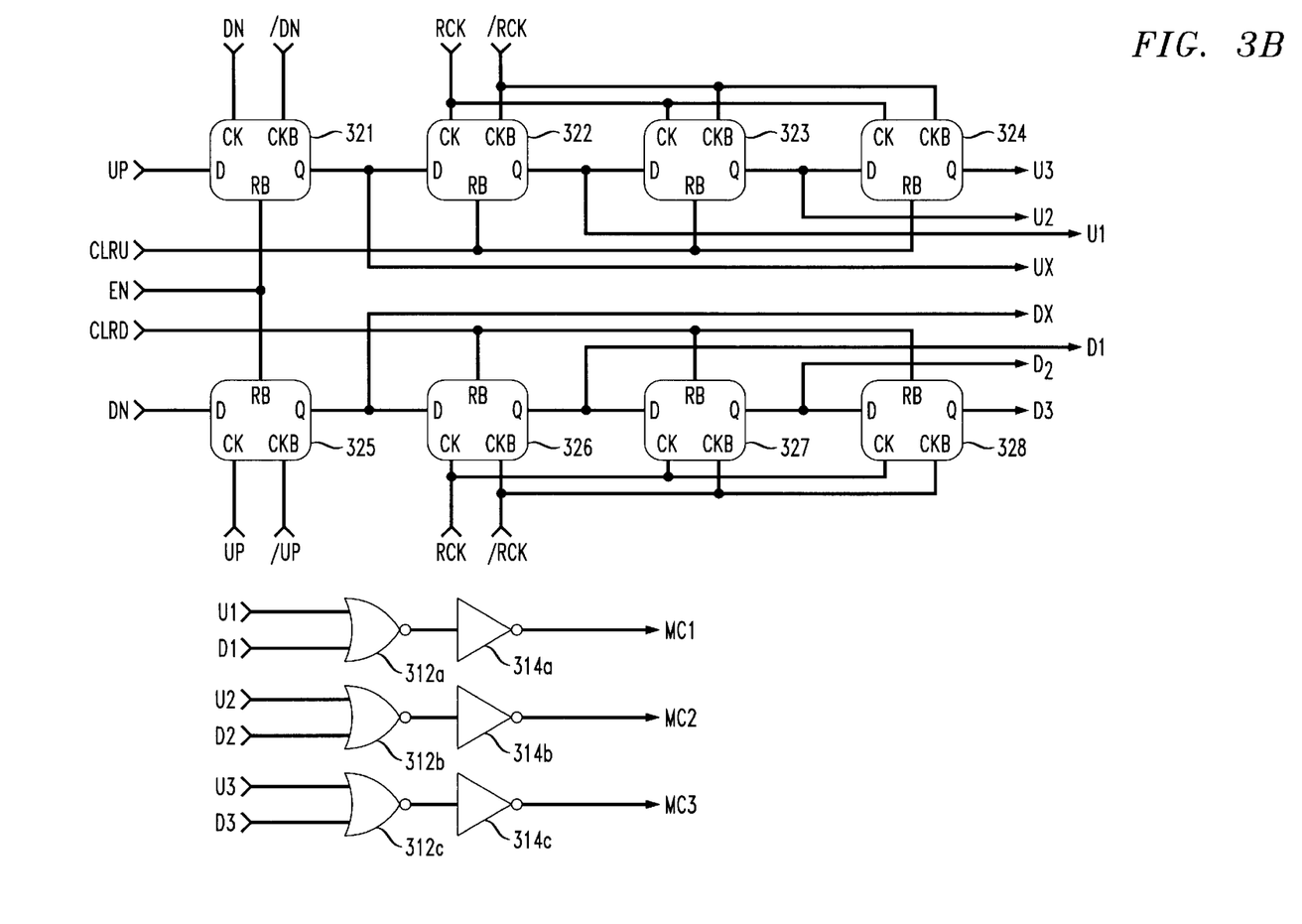

FIG. 3A and 3B are a schematic diagram of an exemplary embodiment of the digital phase detector 202 shown in FIG. 2. FIG. 3A shows the generation of the UP and DN control signals as well as other internally used control signals within the digital phase detector 202, and FIG. 3B shows the generation of a magnitude control signal MC, in accordance with the principles of the present invention. This embodiment of a digital phase detector 202 takes advantage of the small overlap time of the pulses of the UP/DN control signals to avoid short pulse effects as in a conventional digital phase detector, e.g., as shown in FIG. 1.

The inventive digital phase detector 202 shown in FIGS. 3A and 3B includes as one component an otherwise conventional digital phase detector 300 to provide the conventional UP and DN control signals from the input reference frequency signal $f_{REF}$ and variable frequency signal $f_{VAR}$ (and an appropriate enable signal EN). The remainder of the circuitry shown in FIGS. 3A and 3B is used to generate the magnitude control signal MC.

In particular, a buffer 306 provides a buffered clock signal RCK as well as an inverted clock signal /RCK, both based on the input reference frequency signal $f_{REF}$. These buffered clock signals RCK and /RCK are used to clock a series of D type Flip-Flops 321–328 shown in FIG. 3B.

A three-bit magnitude control signal MC is generated mainly by two rows of D type Flip-Flops 321–328. In this exemplary embodiment, Flip-Flops 321–328 are positive edge triggered with synchronous clear when the RB input is at a logic LOW. The upper row of D type Flip-Flops 321–324 records the number of consecutive UP pulses, and the bottom row of D type Flip-Flops 325–328 records the number of consecutive DN pulses.

The first D type Flip-Flop 321 in the first row and the first D type Flip-Flop 325 in the second row are arranged somewhat differently from the remaining D type Flip-Flops 322–324 and 326–328 in the respective rows.

For instance, the first D type Flip-Flop 321 in the first row inputs the UP control signal and is clocked by the DN and inverted DN signal (i.e., /DN control signal). It is preferable that the width of both the UP and DN control signals be minimized, e.g., to no greater than 0.5 nanoseconds (nS), to correct for the delays caused by the D type Flip-Flops 321–328.

Figure 4:
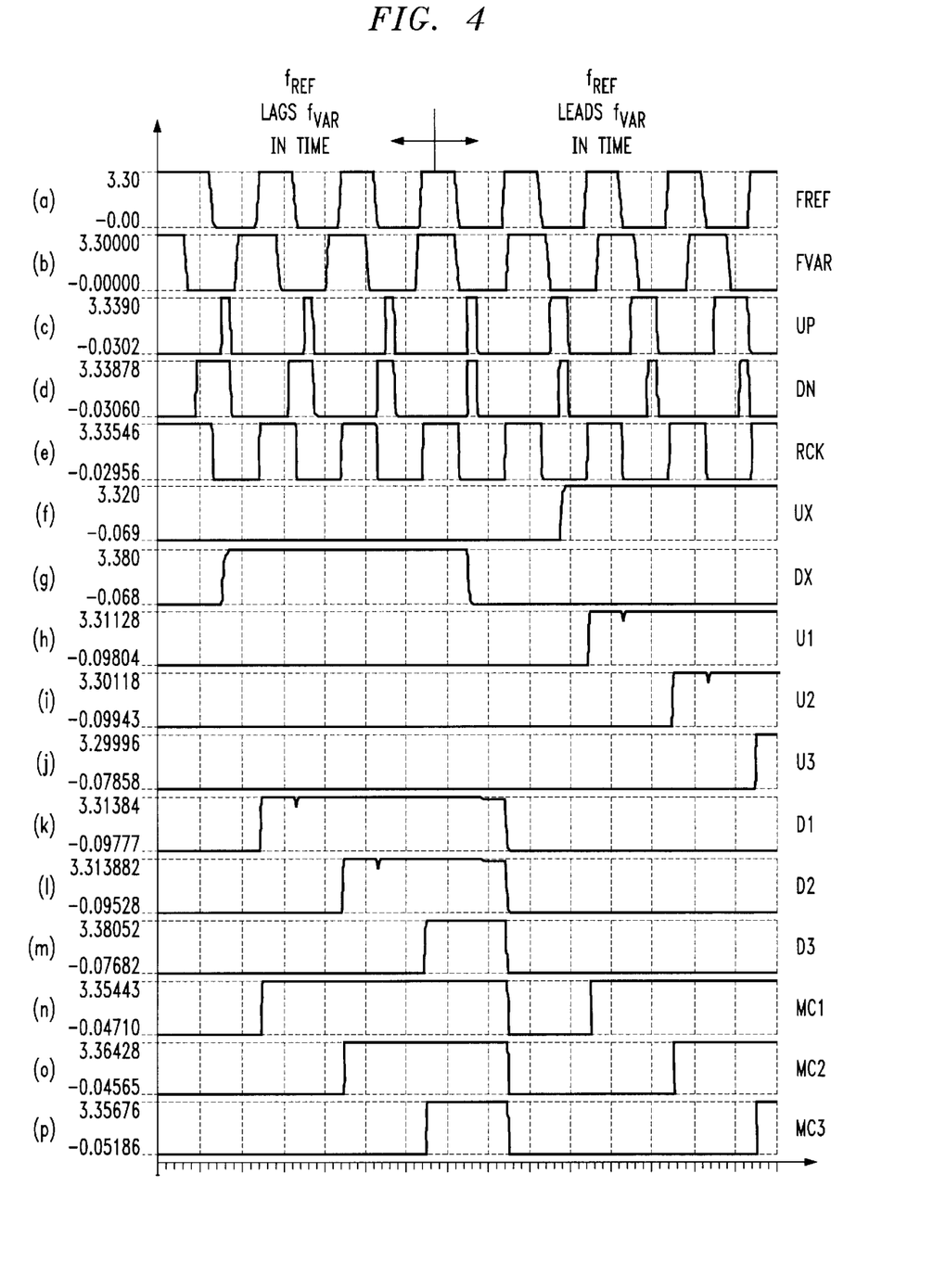
FIG. 4 is a plot showing simulation waveforms for explaining the operation of the digital phase detector shown in FIGS. 2, 3A and 3B.

The operation of the digital phase comparator with magnitude detection is illustrated in FIG. 4. Starting at the top of the figure, the feedback signal, $f_{VAR}$ leads the reference clock, $f_{REF}$ at the start of the simulation (time=0), and progressively slows down with time so that the rising edges of $f_{VAR}$ and $f_{REF}$ are coincident by the middle of the plot (time=35 to 40 ns) and $f_{REF}$ leads $f_{VAR}$ by the end of the plot (time=75 nanoseconds (nS)). While $f_{VAR}$ leads $f_{REF}$, the UP waveform is a series of minimum width pulses and the DN pulse width is proportional to the amount of time that $f_{VAR}$ leads $f_{REF}$. At about the mid point in the plot, the width of the DN pulse has been reduced to its minimum and the UP pulse progressively widens as the lag between $f_{VAR}$ and $f_{REF}$ increases.

From waveform (f) in FIG. 4, it can be seen that the output signal UX is maintained at a logic HIGH for the period that the phase of the variable frequency signal $f_{VAR}$ falls behind that of the reference frequency signal $f_{REF}$.

Similarly, with reference to FIG. 3B, the first D type Flip-Flop 325 in the second row inputs the DN control signal and is clocked by the UP and inverted UP signal (i.e., /UP control signal). Moreover, as shown by waveform (g) of FIG. 4, the output signal DX is maintained at a logic HIGH for the period that the phase of the variable frequency signal $f_{VAR}$ precedes that of the reference frequency signal $f_{REF}$.

The remaining D type Flip-Flops 322–324 and 326–328 shown in FIG. 3B are all clocked by the buffered clock signal RCK and the buffered and inverted clock signal /RCK, to form respective shift register chains. The length of the shift register chain (e.g., which is 3 as shown in FIG. 3B) can of course be varied according to design needs within the principles of the present invention.

Similarly, D type Flip-Flops 321–324 form an upper 3 bit shift register. When the phase of the variable frequency signal $f_{VAR}$ falls behind that of the reference frequency signal $f_{REF}$, UX is maintained at a logic HIGH as shown in waveform (f) of FIG. 4 for a range of 45 to 75 nS. Also, the shift resistor signals U1 to U3 sequentially follow the UX signal to become respective logic HIGH levels on the rising edge of the reference frequency signal $f_{REF}$. Thus, when the variable frequency signal $f_{VAR}$ becomes ahead in phase, the signal UX becomes a logic LOW, DX is high, and the logic at the bottom of FIG. 3A clears U1 to U3 to a logic LOW, and thus all bits of the upper shift register 322 to 324 are cleared.

The D type Flip-Flops 326–328 form a lower 3 bit shift register. When the phase of the variable frequency signal $f_{VAR}$ becomes ahead of that of the reference frequency signal $f_{REF}$, the signal DX shown in waveform (g) of FIG. 4 is maintained at a logic HIGH level in a range of 0 to 30 nS. This causes the shift register signals D1 to D3 to be sequentially clocked to logic HIGH levels on the rising edge of the reference frequency signal $f_{REF}$. When the variable frequency signal $f_{VAR}$ becomes aligned with the reference frequency signal $f_{REF}$, or goes behind in phase, the signal DX becomes a logic LOW level, UX becomes a logic HIGH, and the logic at the bottom of FIG. 3A clears D1 to D3, and thus all bits of the lower shift register 326–328 are cleared.

When the variable frequency signal $f_{VAR}$ is aligned with the reference frequency signal $f_{REF}$, the UP and DN control signals are both at minimum pulse width, the signals UX and DX both become a logic LOW level, and all of the D type Flip-Flops 321–328 in both the upper and lower rows are cleared, as shown in the range 35–40 nS in the waveforms of FIG. 4. The U1 to U3 and D1 to D3 signals are synchronized by the rising edge of the reference frequency signal $f_{REF}$ and thus are late by a half cycle.

Finally, the U1 to U3 and D1 to D3 signals are logically ORed in bit-wise fashion by NOR gate(s) 312, and inverted by an inverter if desired, to form a magnitude control signal MC in accordance with the principles of the present invention.

While the D type Flip-Flops 322–324 and 326–328 are shown as forming a shift register, other configurations are within the scope of the present invention. For instance, instead of shift registers measuring the magnitude of the UP or DN control, a bit counter may be implemented in certain applications and appropriately interpreted within the controlled oscillator 104 to adjust a step size.

In accordance with the principles of this aspect of the present invention, a digital phase locked loop includes a digital phase detector which provides a magnitude control signal to adjust the step size of up and down adjustments of the phase/frequency of a digitally controlled oscillator, resulting in a shorter lock-in or acquisition time and a smaller jitter as compared to conventional digital phase locked loop devices.

In a conventional digital phase frequency detector 102 shown in FIG. 1, a charge pump in the digitally controlled oscillator 104 transforms the UP and DN pulse signals output by the digital phase frequency detector 102 into a pulse current for charging and discharging a capacitor in a related loop filter in the digitally controlled oscillator 104. The pulsed current to the capacitor changes the voltage across the capacitor, which then controls the oscillating frequency of a voltage controlled oscillator (VCO). However, conventional charge pumps do not having programmable magnitude control. FIGS. 5–10 relate to an embodiment of a pulse controlled charge pump 502 having magnitude control of a current pulse output.

Conventional CMOS designs of charge pumps have some difficulty in providing a high current output with precision. In particular, in sub-micron processes, the output current usually deviates from the targeted design value by a large percentage particularly because of short-channel effects. Unfortunately, in certain applications such as in radio frequency synthesis, tight PLL specifications and noise performance requirements demand higher output currents, e.g., in a range of 175 to 2000 microamperes (uA), with high precision and low charge injection. Conventional charge pumps do not provide such high output current with the high precision necessary for many of today's applications, particularly when swung through a range of magnitude in accordance with the principles of the present invention.

Figure 5:
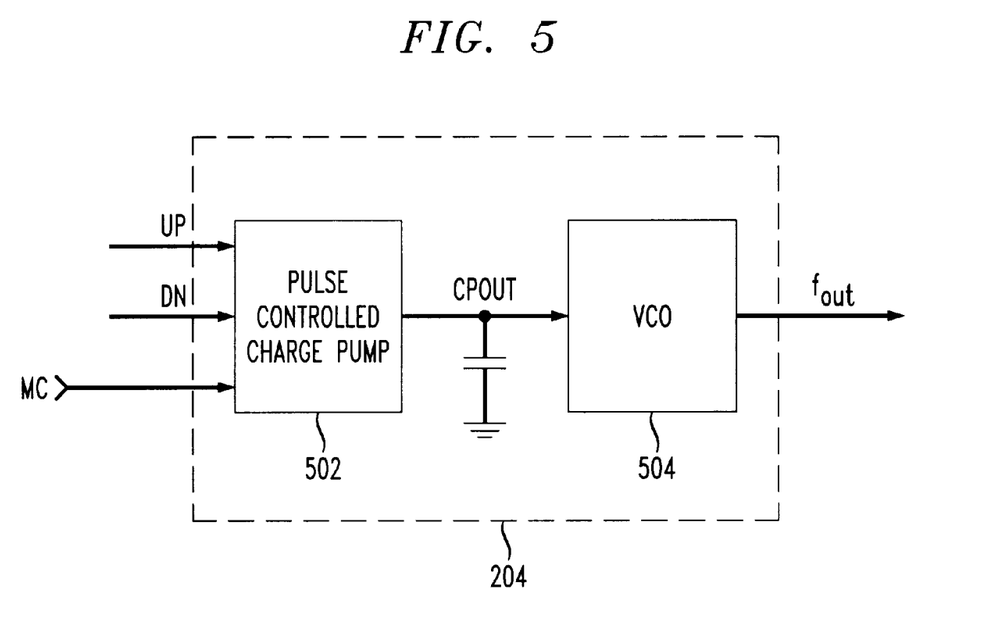
FIG. 5 is a block diagram of an embodiment of a digitally controlled oscillator in accordance with the principles of another aspect of the invention.

FIG. 5 is a block diagram of an embodiment of a digitally controlled oscillator 204 including a pulse controlled charge pump 502 having the unique combination of high-current and high-precision, and programmable magnitude input, in accordance with the principles of another aspect of the invention. The disclosed pulse controlled charge pump 502 was implemented using a 0.3 micrometer (um) CMOS process. Of course, the principles relate equally to any suitable manufacturing processes.

As shown in FIG. 5, the pulse controlled charge pump 502 receives the UP and DN signals as well as the magnitude control signal MC from the digital phase frequency detector 202, and provides a high current, high precision output current pulse CPOUT having programmable range to a voltage controlled oscillator VCO 504, which outputs the desired output frequency from the PLL 200. The larger the charge pump output current pulse CPOUT, the faster the capacitor charges and the faster changes to the output frequency fout occur.

The charge pump output CPOUT is a high precision programmable current from 175 uA to 2000 uA, with each subsequent current value being increased by a ratio of about the square root of two.

Figure 6:
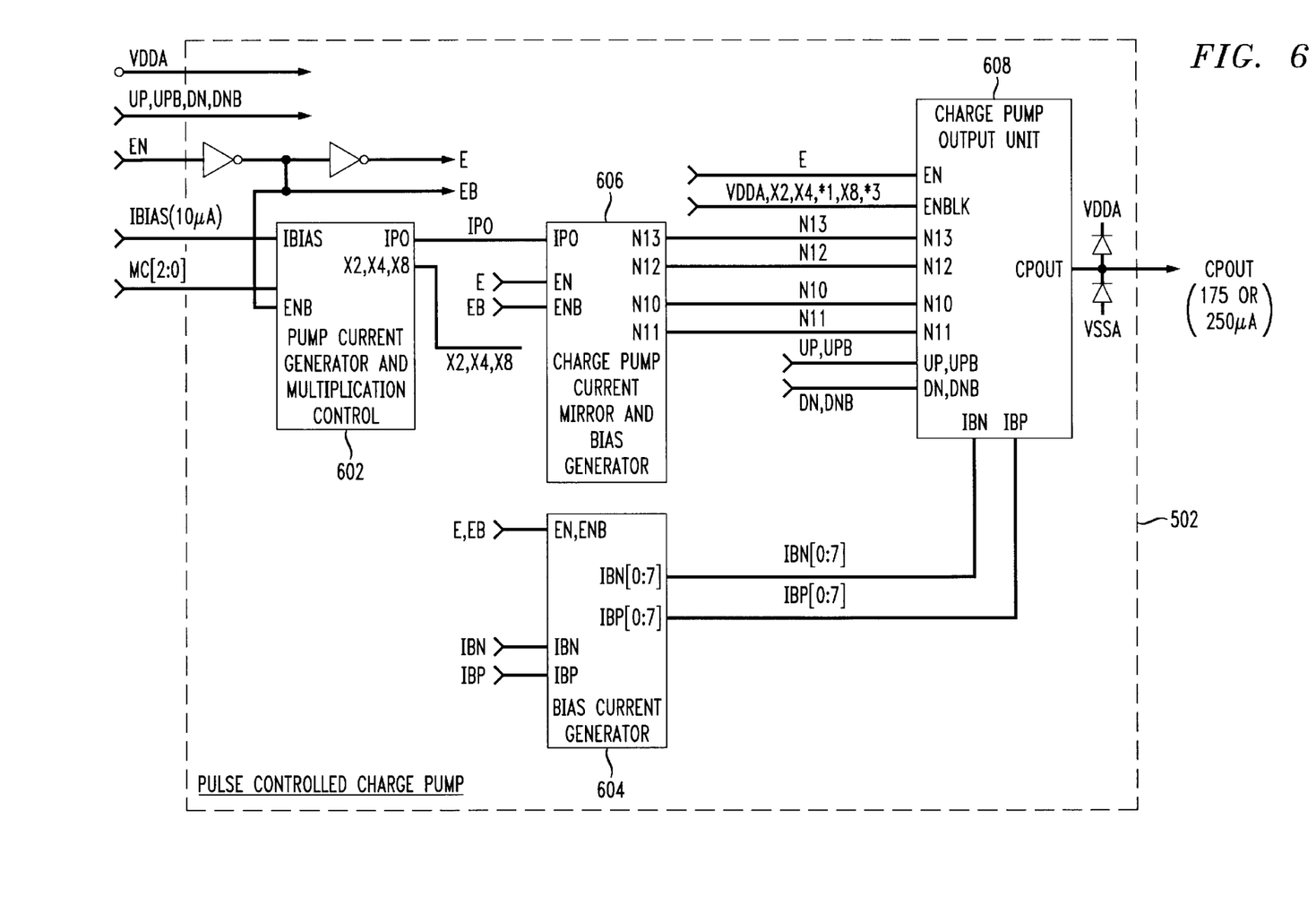
FIG. 6 is a block diagram of an embodiment of a pulse controlled charge pump shown in FIG. 5.

FIG. 6 is a more detailed block diagram of an embodiment of a pulse controlled charge pump 502 shown in FIG. 5.

In particular, the pulse controlled charge pump 502 includes a pump current generator and multiplication control 602, a charge pump current mirror 606, and a charge pump output unit 608. A bias current generator 604 provides bias current to the charge pump output unit to maintain a base or reference charge on the capacitor to maintain a reference frequency output from the PLL.

The pulse controlled charge pump 502 receives a bias current IBIAS of, e.g., 10 uA as reference, attaining 17.5 or 25 uA current output from a first stage current mirror provided by the pump current generator and multiplication control 602. The second stage, the charge pump current mirror 606, is a cascoded wide-swing current mirror. The charge pump current mirror 606 is used as buffer stage between the first current mirror in the pump current generator and multiplication control 602 and the output current driver in the charge pump output unit 608. The combination of the pump current generator and multiplication control 602, the charge pump current mirror 606, and the charge pump output unit 608 provide a high precision current pulse output having a sufficiently large voltage and current range to allow precise programmability without current degradation in any particular range.

The input signals to the pulse controlled charge pump 502 include the instruction signals UP and DN and their complements, UPB and DNB, respectively, a universal enable signal EN, a reference current input IBIAS (10 uA), and a three bit current magnitude control signal MC[2:0]. Two bias current input signals IBN and IBP are input to the bias current generator 604, which replicates the bias currents for each current driver. Thus, the bias current signals IBN[0:7] and IBP[0:7] output from the bias current generator are provided to the respective current mirrors within each current driver in the charge pump output unit 608. The output from the pulse controlled charge pump 502 is the programmable, magnitude controllable output current pulse CPOUT.

Figure 7:
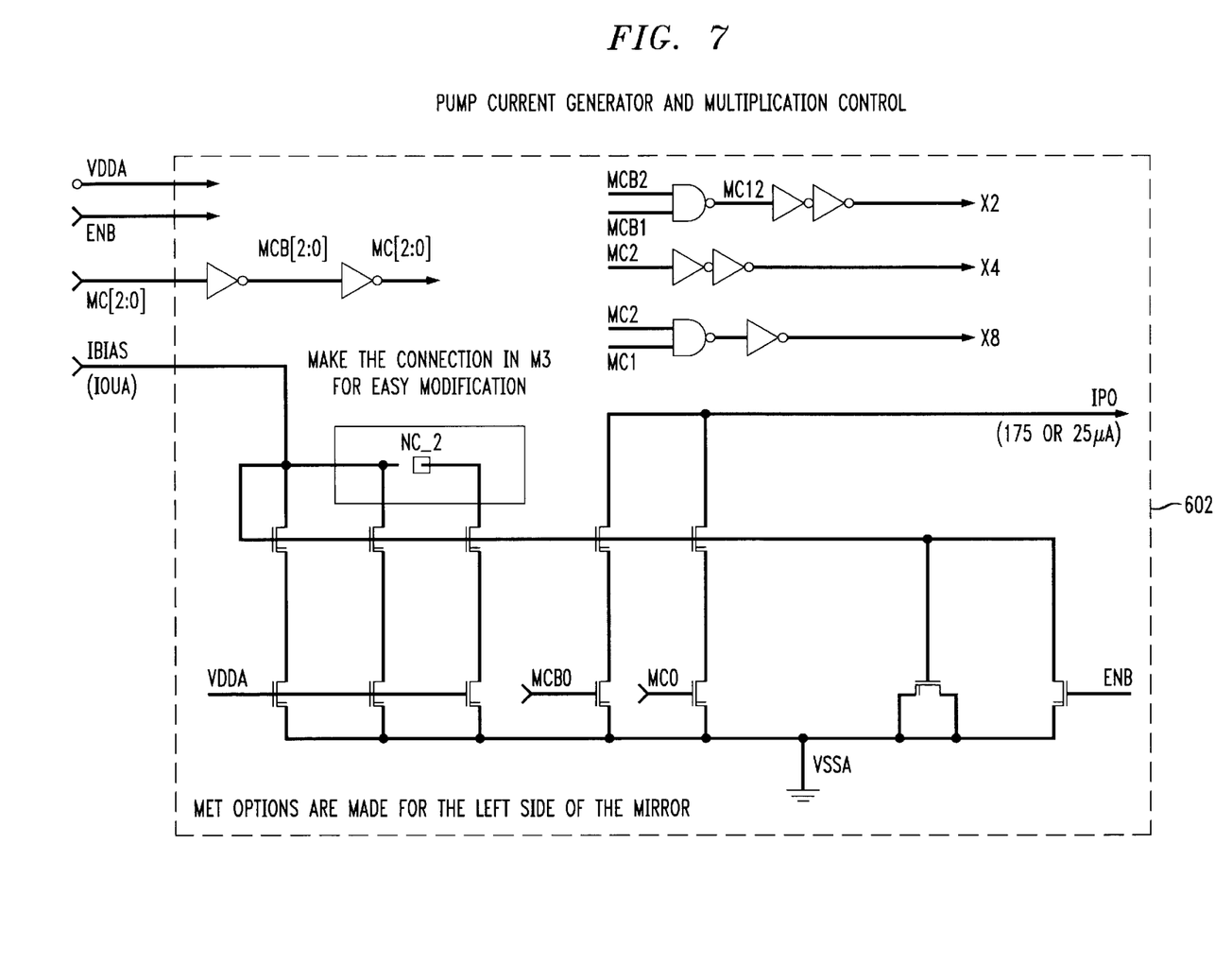
FIG. 7 is a schematic diagram of an exemplary pump current generator and multiplication control module shown in FIG. 6.

FIG. 7 is a schematic diagram of an exemplary pump current generator and multiplication control module shown in FIG. 6.

Programmability of the pulse controlled charge pump 502 is achieved through two basic steps. First, the magnitude control signal MC is provided to the first stage, i.e., to the pump current generator and multiplication control 602. Within the pump current generator and multiplication control 602, the least significant bit (LSB) of the magnitude control signal MC directly controls a current mirror to select a current output level, e.g., 17.5 or 25 uA in the disclosed embodiment. The most significant bits determine the number of unit drivers which will be enabled to provide the desired current magnitude.

The pump current generator and multiplication control 602 receives the reference current IBIAS and the magnitude control signal MC, and outputs a current signal IPO and a plurality of multiplication controls signals X2, X4, X8.

The current signal IPO is either 17.5 uA or 25 uA in the disclosed example, depending on the status of the LSB of the magnitude control signal. Thus, if the LSB is at a logic low, the current signal will be 17.5 uA, while if it is at a logic high, the current signal will be 25 uA in the disclosed example.

The multiplication control signals X2, X4 and X8 are decoded from the most significant bits (MSBs) of the magnitude control signal MC, e.g., MC[2:1]. When the multiplication control signal X2 is enabled, two of the eight available current drivers in charge pump 608 will be enabled. (Additional details regarding the charge pump 608 will be discussed herein below following the discussion of the pump current generator and multiplication control 602 and the charge pump bias 606.) Similarly, when the multiplication control signal X4 is enabled, four of the current drivers will be enabled, and when the multiplication control signal X8 is enabled, all eight current drivers will be enabled.

For example, if the magnitude control signal MC from the digital phase frequency detector 202 (FIG. 2) is "100", the LSB of "-0" will select 17.5 uA for output by the current signal IPO. This is scaled by the bias generator 606 and the charge pump 608 to output 175 uA from CPOUT of 608 for each driver in 608 enabled by the magnitude control signal MC.

With respect to the remaining bits, i.e., the MSBs, a "00-" would decode into X8=X4=X2=0, a "01-" would decode into X8=X4=0, X2=1, a "10-" would decode into X8=X2=0, X4=1, and a "11-" would decode into X8=X4=X2=1. Thus, since in the given example X8 and X2 equal 0 and X4=1, and since each enabled current driver will output a current of 175 uA, four output drivers in the charge pump output unit 608 will be enabled to provide a total output current in the current output CPOUT of (175=4)=700 uA.

Although the present embodiment implements up to eight current drivers, the use of fewer or more current drivers is within the scope of the present invention.

Figure 8:
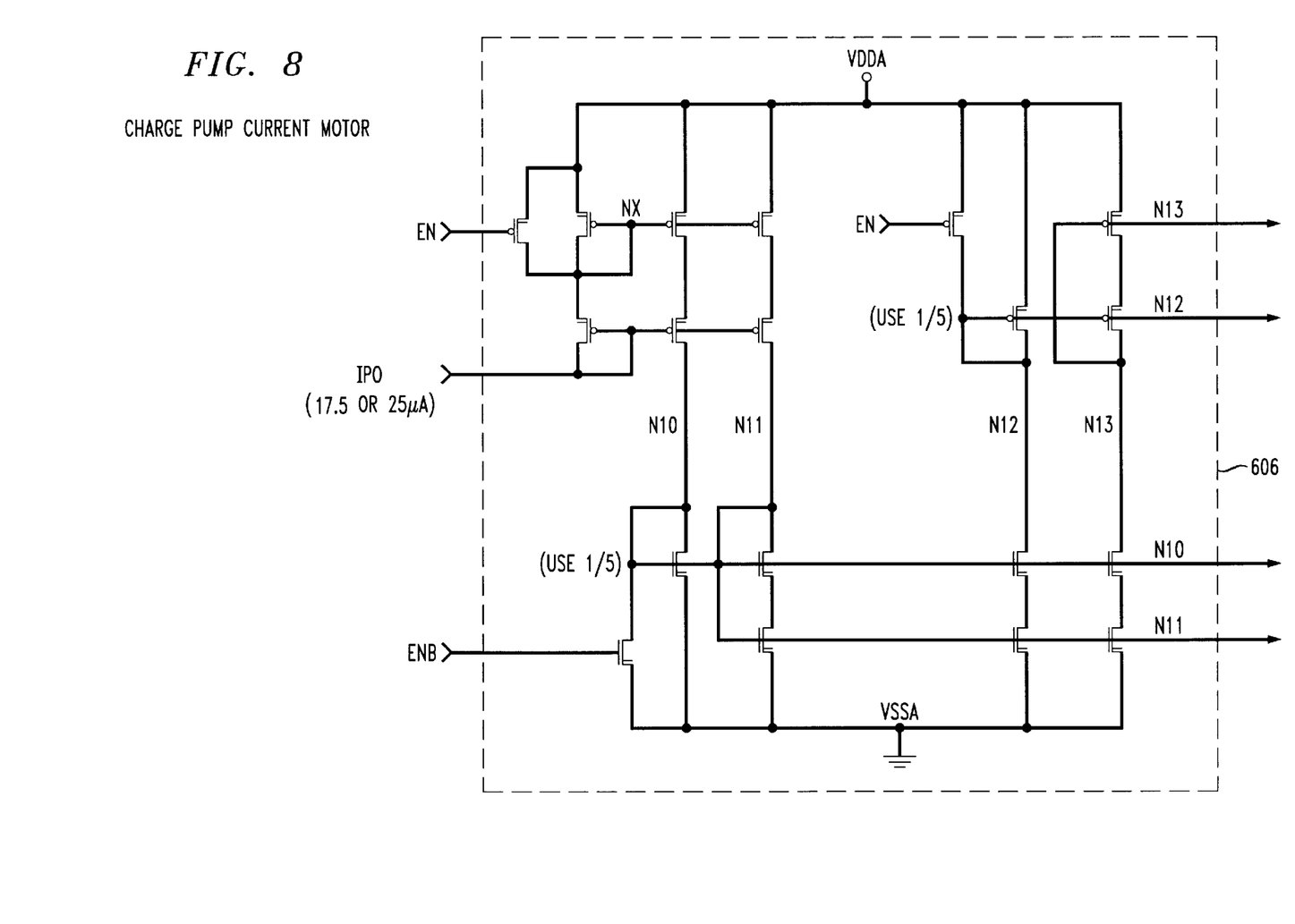
FIG. 8 is a schematic diagram of an exemplary charge pump mirror shown in FIG. 6.

FIG. 8 is a schematic diagram of an exemplary second stage, the charge pump current mirror bias generator 606 shown in FIG. 6.

The charge pump current mirror bias generator 606 comprises the devices that bias the wide-swing cascoded current mirror used in the charge pump 608. The output signals N10–N13 provide suitable bias voltages for the current drivers in the charge pump output unit 608. The bias circuit 606 links the internal current signal IPO to the multiple output drivers in the charge pump output unit 608, which can each be used in either direction, i.e., as a current source or as a current sink. The cascoded bias outputs enable the output current pulse signal CPOUT to maintain high precision through the large range of outputs, from only one driver enabled at its lowest level, e.g., at 175 uA, to all eight drivers enabled at their highest level, e.g., 8×250 uA=2000 uA).

Figure 9:
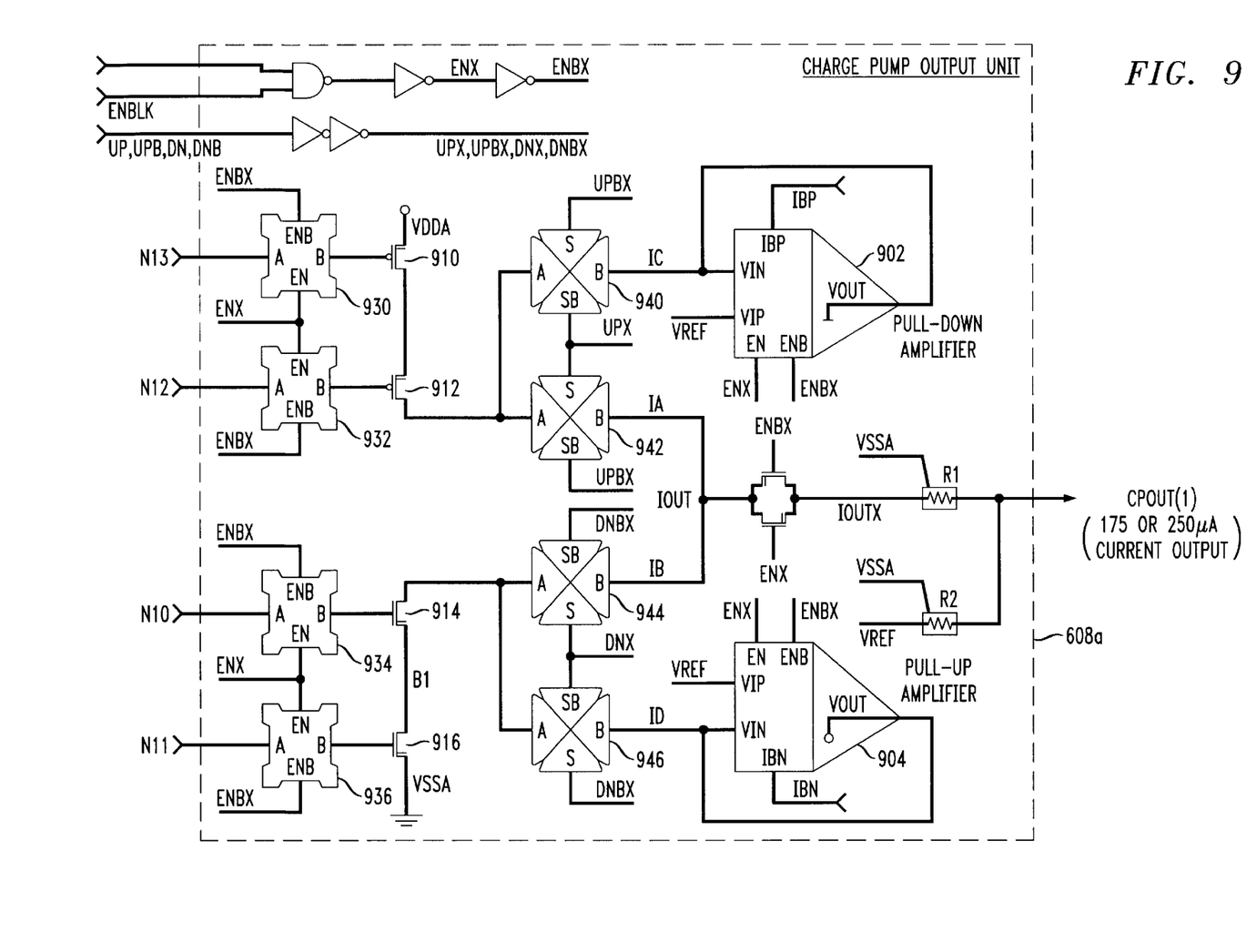
FIG. 9 is a schematic diagram of an exemplary charge pump output unit shown in FIG. 6.

FIG. 9 is a schematic diagram of one driver of an exemplary charge pump output unit shown in FIG. 6.

The final stage of the pulse controlled charge pump 502, the charge pump output unit 608, is an array of, e.g., eight unit current drivers, each outputting a current of 175 uA or 250 uA, depending upon the status of the magnitude control signal. FIG. 9 shows one such driver 608a.

Each driver 608a is provided with a unique, individual enable signal to allow programmability in the output current with a resolution as small as one driver. Obviously, the more drivers that are enabled, the higher the total output current.

The input to each driver 608a includes the universal enable signal EN, a block enable signal ENBLK, the instruction signals UP and DN and their complement signals UPB and DNB, respectively. The output ports CPOUT(1) of each of the eight drivers 608a are tied together to provide the total current for a pulse output signal CPOUT to the VCO 504 (FIG. 5).

The exemplary driver shown in FIG. 9 comprises two cascoded MOS transistors 910 and 912 connected to a power source VDDA and providing a current source, while cascoded MOS transistors 914 and 916 connected to ground VSSA provide a current sink.

Two switch controlled paths IA and IB are connected to the output path CPOUT(1), while two balancing paths IC and ID are connected to a pull-down amplifier 902 and pull-up amplifier 904, respectively. Both the pull-down amplifier 902 and the pull-up amplifier 904 are enabled by the combined enable signals ENX and ENBX. The balancing paths IC and ID together with the pull-down amplifier 902 and pull-up amplifier 904 provide protection from the effects of charge injection.

The cascoded transistors 914 and 916 sink current input from the current output line CPOUT(1) when the path IA is switched off. Similarly, the cascoded transistors 910 and 912 feed a current to the current output line CPOUT(1) when the path IB is switched off. Operation of the cascoded transistor current source 910 and 912 as well as the cascoded transistor current sink 914 and 916 are enabled by the combined enable signals ENX and ENBX.

The amount of current sourced by each driver 608a is set by the signals N12 and N13, and the amount of current sunk by each driver 608a is set by the signals N10 and N11.

The four switches 940–946 are controlled by the up and down instruction pulses UPX and DNX together with their complementary signals UPBX and DNBX, respectively (the 'X' representing the driver number). The switch 942 is used to connect the cascode current source 912 and 910 to the output when the charge pump is to source current. When the driver is to sink current, switch 942 is open and switch 944 closes so the cascode current source 914 and 916 can pull current from the output. To minimize the effects of switching the current source on and off, the cascode current source 912 is connected to node ID through switch 940 when switch 942 is open. The pull-down amplifier 902 tracks the output node voltage (CPOUT(1)) so the drain of the cascode current source 912 is operating at the same potential as if switch 942 was closed. Similarly, switch 946 and pull-up amplifier 904 are used to keep the cascode current source 914 at the same potential as CPOUT when switch 944 is open. This method of minimizing the current switching transients is discussed in detail in U.S. Application Ser. No. 09/188,241, by Wenzhe Luo, entitled "Reduced Charge Injection In Current Switch", co-filed on even date herewith.

Accordingly, due to the use of mirror current paths in each driver 608a of the charge pump output unit, the pulse controlled charge pump 502 as shown in FIG. 9 has greatly minimized MOS charge injection effects.

Figure 10:
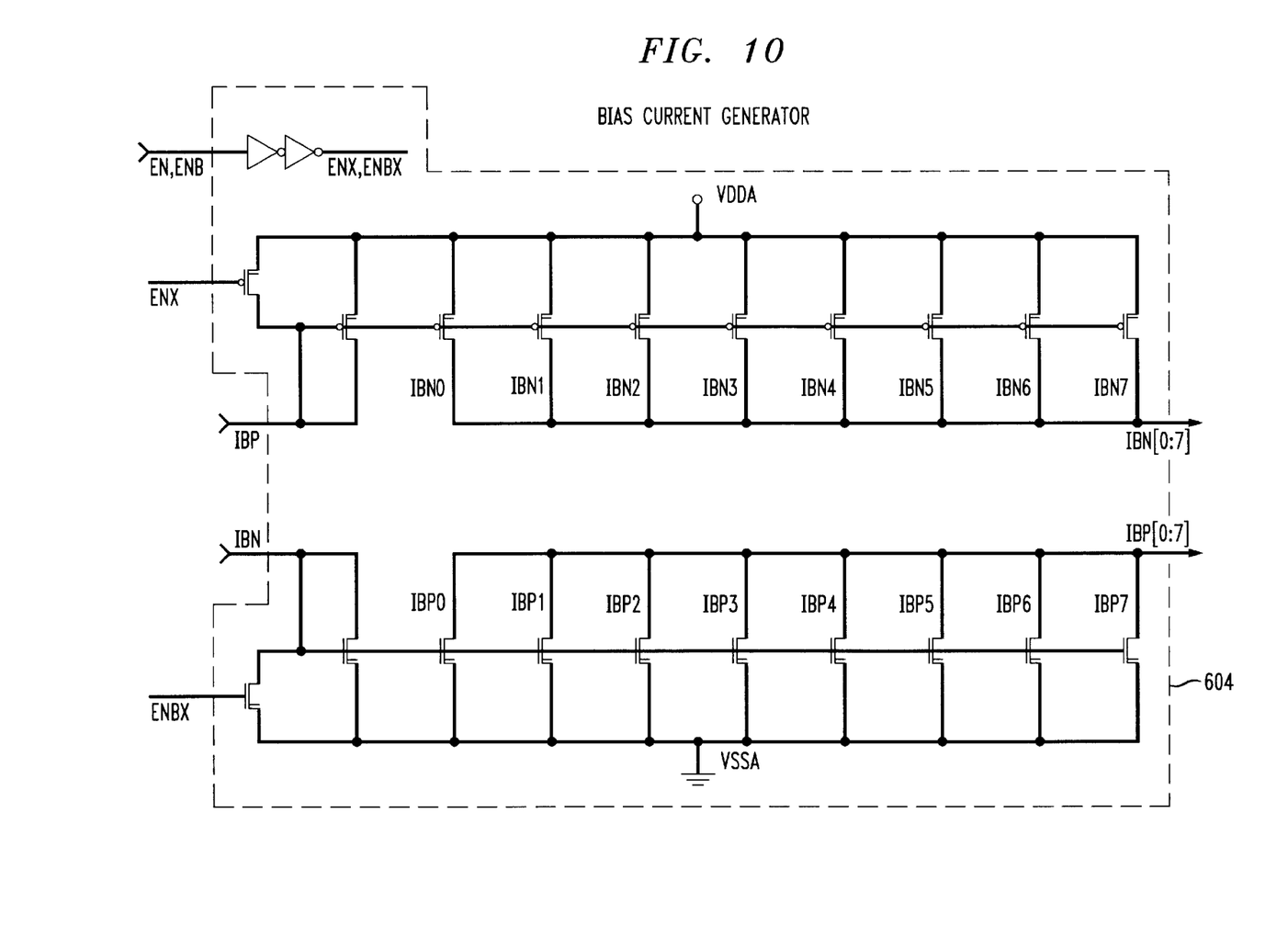
FIG. 10 is a schematic diagram of an exemplary bias current generator shown in FIG. 6.

FIG. 10 is a schematic diagram of an exemplary bias current generator 604 shown in FIG. 6. The bias current generator replicates the current input signals IBP and IBN for use by each current driver 608a in the charge pump output unit 608. The bias current signals IBN[0:7] and IBP[0:7] output from the bias current generator 604 are provided to the respective pull-up amplifiers 904 and pull-down amplifiers 902, respectively, within each current driver 608a in the charge pump output unit 608.

The invention has particular application for cordless devices, and/or particularly in the design of phase-locked loops which utilize a digital phase-detector and a charge pump.

Although the specific embodiment of a pulse controlled charge pump disclosed herein relates to an adjustable current output of 175 or 250 microamperes (uA), the principles relate particularly to adjustments among any output level.

While the invention has been described with reference to the exemplary embodiments thereof, those skilled in the art will be able to make various modifications to the described embodiments of the invention without departing from the true spirit and scope of the invention.

What is claimed is:

1. A digital phase locked loop, comprising:

a digital phase detector; and a digitally controlled oscillator;

said digital phase detector controlling said digitally controlled oscillator with two directional controls and at least one magnitude control.

2. The digital phase locked loop according to claim 1, further comprising:

a frequency divider in a feedback path between said digitally controlled oscillator and said digital phase detector.

3. The digital phase locked loop according to claim 1, wherein said digital phase detector comprises:

at least one shift register for measuring a number of signals indicating a first common direction of movement of an output of said digitally controlled oscillator.

4. The digital phase locked loop according to claim 3, wherein:

said first common direction of movement is one of up and down.

5. A digital phase detector, comprising:

a comparator adapted to compare at least one of a phase and a frequency of a reference signal to at least one of a phase and a frequency of a variable signal, and to output at least one directional signal indicating a determined direction for said variable signal to be changed to equate to said reference signal; and a magnitude measurement circuit adapted to measure a magnitude between said reference signal and said variable signal, and to output a relative magnitude signal indicating a magnitude of said variable signal to be changed to equate to said reference signal.

6. The digital phase detector according to claim 5, wherein:

said magnitude measurement circuit is a shift register.

7. The digital phase detector according to claim 5, wherein said magnitude measurement circuit comprises:

at least one shift register adapted to measure a relative magnitude of difference between said variable signal and said reference signal based on a number of consecutive pulses for movement of said variable signal in a common direction output by said comparator.

8. The digital phase detector according to claim 5, wherein said magnitude measurement circuit comprises:

a first shift register adapted to measure a relative magnitude of difference between said variable signal and said reference signal based on a number of consecutive pulses for movement of said variable signal in an upward direction output by said comparator; and a second shift register adapted to measure a relative magnitude of difference between said variable signal and said reference signal based on a number of consecutive pulses for movement of said variable signal in a downward direction output by said comparator.

9. A method of controlling a digitally controlled oscillator, comprising:

provuding at least one direction control to said digitally controlled oscillator; and providing a magnitude control separate from said direction control to said digitally controlled oscillator;

wherein said digitally controlled oscillator will be caused to step toward a desired frequency at a faster rate when outputting a variable frequency signal which is farther from said desired frequency than when near said desired frequency.

10. The method of controlling a digitally controlled oscillator according to claim 9, wherein said step of providing said magnitude control comprises:

measuring a number of consecutive direction signals for movement of a frequency output from said digitally controlled oscillator in a common direction; and providing said measured number as a magnitude control signal.

11. The method of controlling a digitally controlled oscillator according to claim 10, wherein:

said measurement is counting.

12. The method of controlling a digitally controlled oscillator according to claim 11, wherein:

said counting is performed with a shift register.

13. Apparatus for controlling a digitally controlled oscillator, comprising:

means for providing a direction control to said digitally controlled oscillator; and means for providing a magnitude control separate from said direction control to said digitally controlled oscillator;

wherein said digitally controlled oscillator will be caused to step toward a desired frequency at a faster rate when outputting a variable frequency signal which is farther from said desired frequency than when near said desired frequency.

14. The apparatus for controlling a digitally controlled oscillator according to claim 13, wherein said step of providing said magnitude control comprises:

means for measuring a number of consecutive direction signals for movement of a frequency output from said digitally controlled oscillator in a common direction; and means for providing said measured number as a magnitude control signal.

15. The apparatus for controlling a digitally controlled oscillator according to claim 14, wherein:

said means for measuring includes a shift register.

16. A digital phase locked loop, comprising:

a digitally controlled oscillator;

a digital phase detector comprising: at least one shift register for measuring a number of signals indicating a first common direction of movement of an output of said digitally controlled oscillator; and a second shift register for measuring a number of signals indicating a second common direction of movement of an output of said digitally controlled oscillator opposite said first common direction of movement, wherein;

said digital phase detector controls said digitally controlled oscillator with two directional controls and at least one magnitude control.

17. The digital phase locked loop according to claim 16, further comprising:

a frequency divider in a feedback path between said digitally controlled oscillator and said digital phase detector.

18. The digital phase locked loop according to claim 16, wherein:

said first common direction of movement is one of up and down.

* * * * *